United States Patent [19]

Iio et al.

[11] Patent Number: 5,334,453

[45] Date of Patent: * Aug. 2, 1994

[54] DIAMOND-COATED BODIES AND PROCESS FOR PREPARATION THEREOF

[75] Inventors: Satoshi Iio; Masakazu Watanabe, both of Nagoya; Toshimichi Ito, Tokyo; Masaya Tsubokawa, Sodegaura, all of Japan

[73] Assignees: NGK Spark Plug Company Limited, Nagoya; Idemitsu Petrochemical Company Limited, Tokyo, Japan

[*] Notice: The portion of the term of this patent subsequent to Jun. 26, 2009 has been disclaimed.

[21] Appl. No.: 905,199

[22] Filed: Jun. 26, 1992

Related U.S. Application Data

[63] Continuation-in-part of Ser. No. 634,916, Dec. 27, 1990, abandoned.

[30] Foreign Application Priority Data

Dec. 28, 1989 [JP] Japan ................... 1-344779

[51] Int. Cl.⁵ ................ B23P 15/28; B23B 27/20
[52] U.S. Cl. .................... 428/408; 428/446; 428/698; 428/699; 428/701
[58] Field of Search ............ 428/446, 698, 408, 697, 428/701, 699, 702; 264/65, 66, 337; 501/97

[56] References Cited

U.S. PATENT DOCUMENTS

| | | | |
|---|---|---|---|
| 4,134,947 | 1/1979 | Oda et al. | 106/73.5 |
| 4,578,087 | 3/1986 | Tanaka et al. | 428/698 |
| 4,707,384 | 11/1987 | Schachner et al. | 428/408 |
| 4,734,339 | 3/1988 | Schachner et al. | 428/698 |
| 4,881,950 | 11/1989 | Bhat et al. | 51/307 |
| 4,886,767 | 12/1989 | Goto et al. | 501/97 |
| 4,990,403 | 2/1991 | Ito | 428/408 |

FOREIGN PATENT DOCUMENTS

| | | |
|---|---|---|
| 0378378 | 7/1990 | European Pat. Off. . |
| 3522583 | 2/1986 | Fed. Rep. of Germany . |
| 58-126972 | 7/1983 | Japan . |
| 60-122785 | 7/1985 | Japan . |
| 60-195094 | 10/1985 | Japan . |
| 60-59086 | 12/1985 | Japan . |
| 61-106494 | 5/1986 | Japan . |
| 61-109628 | 5/1986 | Japan . |
| 61-163273 | 7/1986 | Japan . |
| 61-252004 | 11/1986 | Japan . |
| 61-291493 | 12/1986 | Japan . |
| 62-119 | 1/1987 | Japan . |
| 62-107067 | 5/1987 | Japan . |
| 62-196371 | 8/1987 | Japan . |
| 63-20478 | 1/1988 | Japan . |
| 63-20479 | 1/1988 | Japan . |
| 63-33570 | 2/1988 | Japan . |
| 63-100182 | 5/1988 | Japan . |
| 63-306805 | 12/1988 | Japan . |

OTHER PUBLICATIONS

Popper "Sintering of Silicon Nitride, A Review" Progress in Nitrogen Ceramics edited by Riley 1983, pp. 187–210.
Farabow et al "Growth of diamond films by Hot Filament Chemical Vapor Deposition" SPIE vol. 969, 1988 pp. 24–31.
Database WPIL, No. C85–084981, Jul. 1,1985.
Chemical Abstracts, vol. 108, No. 16, Apr. 1988, Abstract No. 136373e.
Chemical Abstracts, vol. 109, No. 6, Aug. 1988, Abstract No. 42547h.
Patent Abstracts of Japan, vol. 12, No. 242 (C–510) (3089) Jul. 8, 1988.
Patent Abstracts of Japan, vol. 11, No. 322 (C–453) (2769) Oct. 20, 1987.
Database WPIL No. C87–014524, Dec. 22, 1986.

*Primary Examiner*—A. A. Turner
*Attorney, Agent, or Firm*—Armstrong, Westerman, Hattori, McLeland & Naughton

[57] ABSTRACT

A diamond-coated body is prepared by coating a diamond film on the surface of a sintered body by means of vapor phase synthesis, the sintered body being so prepared by subjecting a sintered body prepared from ceramics based on silicon nitride to heat treatment at the temperature of 1,400° C. to 1,700° C. as to give a crystalline intergranular phase. The resulting diamond-coated body has excellent adhesion between the diamond film and the substrate and it is appropriately employed for cutting tools and so on because, when applied to the cutting tools, they can be used for cutting for a long period of time.

5 Claims, No Drawings

DIAMOND-COATED BODIES AND PROCESS FOR PREPARATION THEREOF

This application is a continuation-in-part of application Ser. No. 634,916 filed Dec. 27, 1990 now abandoned.

BACKGROUND OF THE INVENTION

1. Field of the Invention

The present invention relates to a body coated with a diamond (hereinafter referred to as a diamond-coated body ) and a process for the preparation thereof and, more particularly, to a diamond-coated body and a process for the preparation thereof, the diamond-coated body having excellent adhesion of a film of the diamond (hereinafter referred to as a diamond film) to a substrate, demonstrating high performance and excellent durability when applied.

2. Description of Related Art

Heretofore, super hard alloys, sintered diamond, single crystal diamond and so on have been employed for tools requiring a high degree of hardness and high abrasion resistance, such as cutting tools and dies.

Among those, diamond tools are particularly preferred due to their excellent properties such as hardness and abrasion resistance.

As diamond tools, there have been employed ones prepared, for instance, by brazing a sintered diamond or a single crystal diamond to the surface of such a substrate as composed of, for example, a super hard alloy or a highly hard metal.

Recently, review has been made on processes for preparing diamond-coated bodies by allowing a diamond film to be deposited on and coating the surface of the substrate composed of the super hard alloy or highly hard metal through the vapor phase diamond synthesis technology such as CVD or PVD methods, and attempts have been made to apply the resulting diamond-coated bodies to those uses as described hereinabove.

It is to be noted, however, that diamond is the hardest substance so that the diamond film to be deposited the surface of the substrate consisting of the super hard alloys or the like is considered to be effectively employed as a coating material or a protective film for providing the substrate with a high degree of hardness and abrasion resistance.

It is thus considered that super hard tools with further improved performance can be prepared, for example, by coating the surface of the substrate consisting of the super hard alloy or the like to be employed for the super hard tools such as cutting tools, dies and so on.

It is to be noted, however, that the adhesion between the surface of the super hard alloy and the diamond film is generally poor and no tools that can withstand actual application have been prepared yet.

Some technology has been proposed in which an intermediate layer is formed between the surface of the super hard alloy and the diamond film with the attempt to improve adhesion between them.

For example, Japanese Patent Laid-open Publication (kokai) No. 126,972/1983 discloses a super hard alloy with a diamond film, which can be prepared by first coating the surface of the super hard alloy with an intermediate layer selected from at least one material selected from the group consisting of a carbide, nitride, boride or oxide of a metal belonging to group IVa, Va or VIa and then coating the surface of the resulting intermediate layer with a diamond film.

As is apparent from the description made immediately hereinabove, the process disclosed in the aforesaid patent laid-open publication adopts a two-step process comprising the first step of coating the surface of the super hard alloy with the intermediate film and the second step of coating the intermediate film with the diamond film, so that this process is said to be laborious in the process for preparation. Further, this process cannot be said to achieve improvement in adhesion of the diamond film to the super hard alloy to a sufficient extent and to a practically applicable level, although the aforesaid patent laid-open publication claims so.

Further, there has been proposed technology for improving adhesion between the substrate consisting of the super hard alloy or the like and the diamond film without forming any intermediate layer.

For instance, Japanese Patent Laid-open Publication (kokai) No. 100,182/1988 discloses a super hard alloy with a diamond film prepared by coating a tungsten carbide type super hard alloy consisting of tungsten carbide in a particular particle size range and containing a particular amount of Co with the diamond film.

The resulting super hard alloy with the diamond film as disclosed in this patent publication, however, cannot be said to demonstrate a sufficiently practical level of adhesion between the super hard alloy and the diamond film.

In particular, if the amount of Co to be added would be increased, the thermal expansion coefficient of the substrate becomes greater and further carbon may be dispersed into Co, thereby making the favorable coating with the diamond film difficult. As a result, the adhesion between the substrate and the diamond film is decreased thereby failing to achieve an adequate degree of durability.

It is generally said that, if the thermal expansion coefficient of the substrate would differ from that of the diamond film to a considerably great extent, it is considered that a great degree of thermal stress may occur within the diamond film upon cooling after coating and this thermal stress works as the cause of a decrease in the adhesion, thereby making it likely to cause damages such as separation of the diamond film from the substrate when employed as a super hard tool.

Recently, in order to improve the adhesion of the diamond film to the substrate with the above matters taken into consideration, extensive development and selection of such a substrate of a new type has been made as consisting of hard materials, particularly such as ceramics (sintered bodies ), having the thermal expansion coefficient close to that of diamond and having the likelihood of being directly coated with the diamond film.

For instance, proposals have been made on attempts to provide diamond-coated bodies having the diamond film coated with high adhesion by using, as the substrate, $Si_3N_4$ ceramics (sintered bodies) containing $Si_3N_4$ as a major component or super hard substrate having controlled thermal expansion coefficient, many of such super hard substrates being a $Si_3N_4$ sintered body or ceramics based on silicon nitride. It can be noted herein that it is known various properties, such as the thermal expansion coefficient, of silicon nitrides may vary with sintering conditions and addition of TiN, TiC, ZrN, SiC, $ZrO_2$, $Al_2O_3$, $Y_2O_3$ or the like (as disclosed, for example, in Japanese Patent Publication (kokoku) No. 59,086/1985 and Japanese Patent Laid-open Publication (kokai) Nos. 122,785/1985, 109,628/1986, 252,004/1986, 291,493/-1986, 107,067/1987, 20,478/1988, 20,479/1988, 33,570/1988, and 306,805/1988).

It is to be noted that the diamond-coated bodies prepared by using those conventional substrates as disclosed in those prior patent publications still have the problems that the adhesion between those conventional substrates and the diamond film is inadequate and they do not have performance, particularly durability, to such a sufficient extent as being required by super hard tools. The problems specifically include a short cutting life when they are employed as cutting tools.

SUMMARY OF THE INVENTION

The present invention has been performed in order to improve the problems inherent in conventional diamond-coated bodies.

The object of the present invention is to provide a diamond-coated body having such a long life as capable of being employed as super hard tools such as cutting tools, abrasionresistant bodies and so on, which is high in performance and excellent in durability, by improving adhesion between a diamond film and a substrate consisting of a hard material.

Another object of the present invention is to provide a process for the preparation of the diamond-coated body as described immediately hereinabove.

As a result of extensive research and studies on guidelines for selecting hard substrates having a sufficient degree of adhesion to the diamond film in order to achieve the aforesaid objects, the following basic findings have been found:

1. The sintered body based on silicon nitride generally possesses physical performance as a substrate in terms of a hard material which is likely to be coated on the surface thereof directly with the diamond film by means of the vapor phase synthesis method al though conventional sintered bodies based on silicon nitride are poor in adhesion between the substrate and the diamond film;

2. Although not restricted to the substrates based on silicon nitride, the substrates may greatly vary in cutting life with their compositions thereof when the body obtained by coating the surface of the substrate with the diamond film is employed as a cutting tool, because the adhesion of the diamond film to the substrate may vary with the composition of the substrate or the like even if the thermal expansion coefficient of the substrate would be equal to that of the diamond. Therefore, sensitive and careful control is required over the composition and micro structure of the sintered body (including the kind of component, phases, the construction of textures thereof, and so on ) to be employed as the substrate because control over a single factor such as thermal expansion coefficient is not sufficient enough to improve the adhesion between the diamond film and the substrate; and 3. For a variety of conventional substrates based on silicon nitride, their various properties and characteristics other than their thermal expansion coefficient can be controlled because the compositions and micro structures of the resulting sintered body can be altered by changing the kind and content of an additive to be employed as well as sintering conditions or treating conditions prior to and subsequent to the sintering treatment.

Hence, in order to design a substrate so as to have excellent adhesion to the diamond film mainly on the basis of the aforesaid basic findings, extensive review has been made mainly in terms of the composition and micro structure of the sintered body as to the cause of deteriorating the adhesion of the ceramics based on silicon nitride (sintered body) to the diamond film, the ceramics having been conventionally proposed as the substrate. As a result, the following facts have been found of importance.

In other words, heretofore, ceramics consisting mainly of a silicon nitride are usually sintered by adding a sintering aids for forming a glassy phase because they are hard to be sintered. It is to be noted, however, that the component constituting the sintering aids remains as an intergranular glassy phase within the sintered body even after sintering, thereby deteriorating heat resistance of the resulting sintered body. Therefore, conventionally, when the sintered body is employed as the substrate for the diamond-coated body, the intergranular component may be evaporated or transformed .prior to or simultaneously with the coating due to high temperatures upon the coating with the diamond film, thereby deteriorating the adhesion between the substrate and the diamond film.

As a result, it has been found that a diamond-coated body excellent in adhesion can be obtained by subjecting the sintered body based on silicon nitride having such an intergranular glassy phase as described hereinabove to crystallization treatment and coating the resulting sintered body having a crystalline intergranular phase with a diamond film, the diamond-coated body being advantageously employed as super hard tools, highly abrasion resistant bodies and so on, having high performance and high durability, such as cutting tools having a long cutting life, and so on. And the present invention has been completed on the basis of the aforesaid finding.

In other words, the present invention provides the diamond-coated body comprising of a substrate consisting of ceramics based on silicon nitride having a crystalline intergranular phase and a film of a diamond-coated directly on a surface of the substrate by means of the vapor phase synthesis method.

Further, the present invention provides a process for the preparation of the diamond-coated body comprising of subjecting the substrate consisting of ceramics based on silicon nitride having an intergranular glassy phase to crystallization treatment and then coating the diamond film on the surface of the resulting ceramics based on silicon nitride having the crystalline intergranular phase by means of the vapor phase synthesis method.

DESCRIPTION OF THE PREFERRED EMBODIMENTS

The present invention will be described in more detail.

The ceramics based on silicon nitride to be employed for the present invention are intended to mean sintered bodies containing crystal particles of silicon nitride, $Si_3N_4$, to be identified by X-ray diffractometry or containing crystal particles to be identified as $\beta$-sialon ($Si_{6-z}Al_zN_{8-z}O_z$, wherein z ranges from 0 to 4.2) by X-ray diffractometry, in which aluminium (Al) and oxygen (O) form a solid solution with $Si_3N_4$ crystals.

In accordance with the present invention, among the ceramics based on silicon nitride, ones having a crystalline intergranular phase (hereinafter referred to sometimes as sintered body having the crystalline intergranular phase or sintered body [I]) are employed as a substrate.

As the ceramics based on silicon nitride (the sintered body [I]) to be used as the substrate in the present invention, the ceramics with a variety of compositions may be employed as long as they are composed mainly of silicon nitride and contain a crystalline intergranular phase. The process for the preparation of the sintered body [I] is not restricted to a particular one and the sintered body [I] may be prepared by various processes. They may appropriately be prepared by subjecting the sintered body consisting mainly of a silicon nitride and containing an intergranular glassy phase (the sintered body being hereinafter referred to sometimes as the sintered body containing the intergranular glassy phase or sintered body [II]) to crystallization treatment.

The sintered body [II] with various known compositions may be employed as long as they are composed mainly of a silicon nitride and they contain an intergranular glassy phase. In order to effectively carry out the crystallization treatment, however, it is preferred that they contain a component for promoting crystallization of the intergranular glassy phase (for example, a nucleating agent).

In other words, the sintered body [II] may be prepared by various processes including known ones, which are not restricted to particular ones. It is preferred that the sintering may be carried out by adding the component for promoting the crystallization, such as the nucleating agent, or a precursor thereof as a component for the starting material of the sintered body.

As the component for promoting the crystallization, there may usually be employed a variety of known nucleating agents which include a Ti compound, such as TiN, or a Zr compound. Among these compounds, the Ti compound is preferred, and TiN is particularly preferred.

It is sufficient that the component for promoting the crystallization may be added to such an extent as effectively converting its intergranular glassy phase into the crystalline intergranular phase. When there is employed, as the component for promoting the crystallization, the Ti compound such as TiN or the like, acting as the nucleating agent or the like, the Ti compound may preferably be employed in the amount ranging usually from 1% to 30% by weight, preferably from 2% to 20% by weight, when converted into TiN.

If the content of the component for promoting the crystallization in the sintered body [II] would be too small, on the one hand, a long period of time is required for heat treatment for crystallization or the crystallization of the intergranular glassy phase becomes insufficient. If the content of the component for promoting the crystallization therein would be too great, on the other hand, the thermal expansion coefficient of the substrate becomes too high, thereby reducing the adhesion of the diamond film to the substrate.

As the silicon components to be used as starting materials for the sintered body [I] or [II], there may be employed various ones which can produce the silicon nitrides, and $Si_3N_4$ is usually appropriate.

The content of the silicon nitride, for example, $Si_3N_4$, in the sintered body [II] and [I] may be usually 50% by weight or greater, preferably from 60% to 90% by weight. If the content of the silicon nitride is too small, on the one hand, its characteristics cannot be demonstrated to a sufficient extent and it may become difficult to control the thermal expansion coefficient of the substrate to a value close to that of the diamond film or to carry out the coating with the diamond film through the vapor phase synthesis method in a smooth way. Hence, in this case, the objects of the present invention may not be achieved.

The sintered body [II] or [I] may contain other various additive components, as needed, within a range which does not impair or impede the objects of the present invention, in addition to the silicon nitrides, such as $Si_3N_4$ or the like, and to the component for promoting the crystallization, such as the Ti compound or the like, or a component capable of being employed as the component for promoting the crystallization.

As the other various additive components, there may be mentioned various ones including those capable of being utilized as additive components such as the known sintered body based on silicon nitride proposed as the conventional sintered body based on the silicon nitride. Specific examples of those additive components may include, for example, oxides of Y, Al, Zr or Mg, such as $ZrO_2$, $MgO$, $Al_2O_3$ and $Y_2O_3$, nitrides thereof, carbides thereof, borides thereof, silicic acid, complex compounds thereof and compositions thereof. There may also be mentioned compounds and compositions of silicon other than the foregoing, such as carbides, oxides as well as complex compounds and compositions of silicon, compounds and compositions of Ti other than the foregoing, and complex compounds and compositions thereof.

These various components for starting materials are not restricted to particular ones and there may appropriately be employed those which are customarily used for the preparation of sintered bodies by sintering the conventional ceramics based on the silicon nitride type.

Among those particularly $ZrO_2$, $MgO$, $Y_2O_3$, $Al_2O_3$ and so on may appropriately be employed.

In accordance with the present invention, the process for the preparation of the sintered body [II] is not restricted to a particular one, and the sintered body [II] may be prepared by various processes including, for example, processes for preparing sintered bodies, such as known sintered bodies based on silicon nitride proposed as the substrates for conventional diamond-coated bodies.

As the processes for the preparation of the sintered body [II], there may appropriately be employed processes for preparing the sintered body based on silicon nitride having the predetermined composition by mixing, as the starting materials, the appropriate Ti compounds functioning as the component for promoting the crystallization, preferably TiN, with the appropriate silicon nitrides, preferably $Si_3N_4$, at predetermined contents, or mixing these compounds with the other appropriate compounds (preferably $ZrO_2$, $MgO$, $Y_2O_3$ and $Al_2O_3$) to be employed as the various components for the starting materials to be added as needed, at predetermined contents, forming the resulting mixture in desired shapes by means of an appropriate forming method such as die pressing or the like, and sintering the green bodies under appropriate sintering conditions to yield the sintered bodies of the predetermined compositions (the sintered body [II]).

Each of the components to be employed as the starting materials for sintering may be employed in a form of powder, fine powder, super fine particle, whisker or any other shape. There may appropriately be employed fine particles or super fine particles having average particle sizes ranging usually from about 0.05 micron to 4.0 microns, preferably from about 0.05 micron to 2.0 microns, and whiskers having aspect ratios ranging from about 20 to 200.

The sintering temperature may adequately range usually from 1,500° C. to 2,000° C., preferably from 1,600° C. to 1,800° C.

The sintering time may adequately be usually 0.2 hour or longer, preferably in the range from approximately 0.3 hour to 10 hours.

It is usually desired to carry out the sintering in nitrogen gas and/or under an inert atmosphere, and the sintering may usually be carried out under normal pressures, elevated pressures or gas pressures.

In accordance with the present invention, the sintered body [I] to be used as the substrate may be appropriately prepared by subjecting the sintered body [II] prepared in the aforesaid manner to crystallization treatment under appropriate conditions so as to convert at least a portion, preferably a substantially whole portion, of the intergranular glassy phase of the sintered body [II] into the crystalline intergranular phase.

Although the crystallization treatment may be carried out by various processes, it may preferably be carried out usually by heating the sintered body [II] at appropriate temperatures.

The conditions for the crystallization treatment by heating cannot be specified uniformly because they may vary with the composition of the sintered body [II] and other conditions. Generally, the crystallization treatment may effectively be carried out by heating the sintered body [II] at temperatures ranging usually from 1,400° C. to 1,700° C., preferably from 1,500° C. to 1,600° C., for periods of time usually of 0.5 hour or longer, preferably ranging from approximately 1 to 10 hours.

When this crystallization method is used, it is necessary to allow the sintered body [II] to cool to a temperature at least approximately equal to room temperature, before it is subjected to crystallization treatment by heating. In general, the temperature appropriate for producing seed crystals is lower than the temperature needed for growing the seed crystals. The cooling step enables seed crystals to form in the sintered body. The seed crystals thus formed are then grown by subjecting the cooled sintered body to a heating step.

Other processes for preparing the sintered body [I] having the crystalline intergranular phase include processes for cooling the sintered bodies under certain cooling conditions, for example, under annealing conditions.

The desired sintered body [I] to be employed as the substrate may be prepared in the manner as described hereinabove.

The sintered body [I] may be prepared by sintering the mixture of the starting materials in a desired shape or, as needed, by processing it into a desired shape subsequent to the sintering treatment or the crystallization treatment, thereby lending itself to the substrate for the diamond-coated body according to the present invention.

In accordance with the present invention, as the sintered body which can particularly be employed as the substrate among the ceramics based on silicon nitride (the sintered body [I]), there may be mentioned the sintered bodies which are to be prepared by mixing $Si_3N_4$, TiN, and at least one material, preferably two materials, of oxides selected from the group consisting of $ZrO_2$, $MgO$, $Y_2O_3$ and $Al_2O_3$, as the starting materials, at predetermined contents, molding or forming the resulting mixture into appropriate shapes by die pressing or the like, then sintering the formed body under the appropriate conditions to thereby yield the sintered body based on silicon nitride (the sintered body [II]) containing the intergranular glassy phase and having the peaks for $\beta$-sialon and TiN observed by the X-ray diffractometry, and further subjecting the sintered body [II] to crystallization treatment to thereby yield the sintered body [I] having the peaks for the $\beta$-sialon and TiN observed by the X-ray diffractometry and containing the melilite phase ($Y_2Si_3N_4O_3$) as the crystalline intergranular phase.

The predetermined contents of the components within the mixture may be such that $Si_3N_4$ may range from 60% to 90% by weight, the Ti compound may range from 1% to 30% by weight, when converted into TiN, and at least one oxide selected from the group consisting of $ZrO_2$, $MgO$, $Y_2O_3$ and $Al_2O_3$ may range from 10% to 40% by weight.

The diamond-coated body according to the present invention may be prepared by coating the desired surface of the sintered body [I] (the ceramics based on silicon nitride having the crystalline intergranular phase) with the diamond film by means of the vapor phase synthesis method.

This diamond film may efficiently be formed with ease and in uniformly film thickness.

In this connection, it is to be noted that the application of the vapor phase synthesis method to conventional super alloy substrates of the WC type presents the problems, for example, that plasma does not converge in a uniform way, thereby making the film thickness of the diamond film irregular.

For the diamond-coated body according to the present invention, the film thickness of the diamond film cannot be determined with accuracy for the reasons which include difficulty in determining the boundary face between the diamond film and the substrate (the sintered body, [I]). Generally, however, it is adequate that the film thickness of the diamond film coated on the substrate may range usually from approximately 0.5 to 100 microns, preferably from approximately 2 to 50 microns, in order to apply the diamond-coated body to cutting tools.

If the film thickness of the diamond film would be too thin, on the one hand, the surface of the substrate may not be coated with the diamond film to a sufficient extent. If the film thickness thereof would become too thick, on the other hand, the risk may be incurred that the diamond film comes off from the surface of the substrate.

In accordance with the present invention, the term "diamond" or related terms as referred to herein is intended to mean diamond containing diamond-like carbon partially and diamond-like carbon as well as diamond itself. As the processes for coating the substrate with the diamond film, a variety of known processes can be applied as long as they are involved with the vapor phase synthesis method. Usually, the following specific process may appropriately be employed.

In other words, the desired diamond film can appropriately be coated on the substrate by the process which follows.

The diamond film may be coated on the surface of the substrate by per se known diamond synthesis method and, among others, the vapor phase diamond synthesis method involving exposing the substrate to plasma gases obtained by exciting carbon source gases is preferred.

Specifically, it is preferred to adopt the process which involves coating the surface of the substrate with the diamond film by bringing the substrate into contact with gases obtainable by exciting raw material gases containing the carbon source gases in a reaction chamber.

The raw material gases may be any gases containing at least carbon source gases and it is preferred that the raw material gases contain carbon atoms and hydrogen atoms.

Specifically, the raw material gases may include, for example, a mixture of gases including carbon source gases and hydrogen gases.

As needed, a carrier gas such as an inert gas may be employed together with the raw material gases.

The carbon source gases may include, for example, gases resulting from various hydrocarbons, halogen-containing compounds, oxygen-containing compounds, nitrogen-containing compounds and so on, and gases obtainable by gasification of carbon such as graphite.

The hydrocarbons may include, for example, a paraffinic hydrocarbon such as, for example, methane, ethane, propane, butane and so on; an olefinic hydrocarbon such as, for example, ethylene, propylene, butylene and so on; an acetylenic hydrocarbon such as, for example, acetylene, allylene and so on; a diolefinic hydrocarbon such as, for example, butadiene and so on; an alicyclic hydrocarbon such as, for example, cyclopropane, cyclobutane, cyclopentane, cyclohexane and so on; and an aromatic hydrocarbon such as, for example, cyclobutadiene, benzene, toluene, xylene, naphthalene and so on.

The halogen-containing compounds may include, for example, a halogen-containing hydrocarbon such as, for example, methylene halide, ethylene halide and benzoic halide, carbon tetrachloride, and so on.

The oxygen-containing compounds may include, for example, an alcohol such as, for example, methanol, ethanol, propanol, butanol and so on; an ether such as, for example, dimethyl ether, diethyl ether, ethyl methyl ether, methyl propyl ether, ethyl propyl ether, phenol ether, acetal, cyclic ethers (such as dioxane, ethylene oxide, etc.) and so on; a ketone such as, for example, acetone, diethyl ketone, pinacolin, aromatic ketones (such as acetophenone, benzophenone, etc.), diketone, cyclic ketones and so on; an aldehyde such as, for example, formaldehyde, acetaldehyde, butyl aldehyde, benzaldehyde and so on; an organic acid such as, for example, formic acid, acetic acid, propionic acid, succinic acid, butyric acid, oxalic acid, tartaric acid, stearic acid and so on; an acid ester such as, for example, methyl acetate, ethyl acetate and so on; a divalent alcohol such as ethylene glycol, diethylene glycol and so on; and carbon monoxide, carbon dioxide, and so on.

The nitrogen-containing compounds may include, for example, an amine such as, for example, trimethylamine and triethylamine.

Among those carbon source gases, there may preferably be employed such a paraffinic hydrocarbon as including methane, ethane, propane and so on, which is gaseous at ordinary temperatures or high in vapor pressure, such a ketone as including acetone, benzophenone and so on, such an alcohol as including methanol, ethanol and so on, and the oxygen-containing compounds such as carbon monoxide and carbon dioxide gases. Among those, carbon monoxide is particularly preferred.

The concentration of the carbon source gases in the total gases may range usually from 0.1% to 80% by volume.

Hydrogen constituting the hydrogen gases may comprise one capable of forming atomic hydrogen when excited.

The atomic hydrogen is considered as functioning as the catalytic action for activating the reaction for coating the diamond film on the surface of the substrate although detail of its mechanism is not clarified. Further, it has the functions for depositing diamond and at the same time for removing non-diamond components such as graphite and amorphous carbon which may be deposited simultaneously with the deposition of the diamond.

As the techniques for exciting the raw material gases, there may be mentioned, for example, microwave plasma CVD method, RF plasma CVD method, DC plasma CVD method, magnetic-field plasma CVD method (including ECR conditions), thermal filament method, thermal plasma CVD method, optical CVD method, laser-induced CVD method, flare combustion method, sputtering method, ion beams method, cluster ion beams method, ion plating method and so on.

Among those as described hereinabove, preferred are various CVD methods and more preferred is plasma CVD method.

In a combination of the raw material gases with the exciting processes, particularly preferred for the objects of the present invention is a combination of a mixed gas between carbon monoxide gas and hydrogen gas with the microwave plasma CVD method (including the magnetic-field CVD method).

In the vapor phase method, the temperature of the substrate at the time of coating with the diamond film may vary with the processes for exciting the raw material gases, so that it cannot be determined uniformly. Generally, it may generally range usually from 300° C. to 1,200° C., preferably from 500° C. to 1,100° C.

If the temperature would become below 300° C., on the one hand, the rate at which the diamond deposits may become slower, thereby losing crystallinity of the diamond to be deposited.

If the temperature would be higher than 1,200° C., on the other hand, the effect cannot be achieved so as to correspond to elevating the temperature, so that the application of such high temperatures may become disadvantageous in terms of energy efficiency, and the deposited diamond may be further subject to etching.

The reaction pressure upon the coating of the diamond film may range usually from $10^{-6}$ to $10^3$ torr, preferably from from $10^{-5}$ to 800 torr. If the reaction pressure would be lower than $10^{-6}$ torr, the rate of depositing the diamond becomes too slow or no diamond may be deposited. On the other hand, if the reaction pressure would be higher than $10^3$ torr, graphite may be formed to a large extent.

The reaction time may vary with the surface temperature of the substrate, the reaction pressure, and the film thickness required, so that it cannot be determined uniformly and it can be determined in an appropriate manner.

The film thickness of the diamond film coated in the manner as described hereinabove may vary to a great extent with uses of the diamond-coated body in which the diamond film is coated on the substrate, so that no restrictions are placed upon the film thickness of the diamond film. The film thickness thereof may usually be 0.3 micron or thicker, preferably in the range from 0.5 micron to 500 microns, more preferably from 1 micron to 100 microns.

The diamond-coated body according to the present invention may be prepared in the manner as described hereinabove.

The diamond-coated body according to the present invention is remarkably superior particularly in adhesion between the diamond film and the sintered body (the sintered body [I]) to be employed as the substrate to conventional diamond-coated body obtainable by coating the diamond film on known ceramics type substrate such as silicon nitride sintered bodies and so on or on super hard alloy substrate. Therefore, for example, the diamond-coated body according to the present invention can remarkably prolong its cutting life, particularly when it is employed as cutting tools to be employed under sever conditions, because it can demonstrate high performance and excellent durability, when it is practically applied to various tools, such as cutting tools and so on, which require high hardness and abrasion resistance.

Therefore, the diamond-coated body according to the present invention may appropriately be utilized, for example, as super hard tools, abrasionresistant tools, abrasionresistant bodies and so on, such as cutting tools, e.g. single point tools, end mills, drills, cutters, etc., dies, wire drawing dies, gauges, heads for bonding tools, etc., or various functional materials which can take advantage of characteristics and functions of the diamond film, such as electronic materials and so on.

The present invention will now be described by way of examples.

EXAMPLE 1

71% by weight of $Si_3N_4$ powders, 11% by weight of $Y_2O_3$ powders, 3% by weight of $Al_2O_3$ powders and 15% by weight of TiN powders were mixed under wet conditions, and dried. The resulting mixed powders were formed green body was then sintered at ordinary pressure under nitrogen atmosphere at 1,700° C. for one hour. The sintered body which in turn was subjected to crystallization treatment by heating it at the temperature of 1,550° C. for two hours under nitrogen atmosphere and mached into a shape of a cutting tool chip (type: SPGN421).

The X-ray diffractometry analysis of the sintered body prepared by the crystallization treatment by heating has revealed that the peaks of the $\beta$-sialon, the TiN and the melilite phase ($Y_2Si_3N_4O_3$) have been observed, thereby confirming that the crystallization of the intergranular glassy phase has proceeded and as a result finding the resulting sintered body to be of the ceramics based on silicon nitride having the crystalline intergranular phase.

The sintered body chips subjected to the crystallization treatment by heating were then placed as the substrate in a reaction vessel of the microwave plasma CVD apparatus and they were coated with the diamond film by carrying out the reaction at the output power of 400 W of microwave (frequency: 2.45 GHz ) for five hours, the substrate temperature of 1,000° C. and the pressure of 40 Torr, while carbon monoxide and hydrogen gases as the raw material gases were flown into the reaction vessel at the rates of 15 sccm and 85 sccm, respectively. So that a deposit having an average film thickness of 10 $\mu$m was formed on the substrate.

The Raman spectrometry of the coated film has revealed that the peak resulting from the diamond appeared in the vicinity of 1,333 $cm^{-1}$ of the Raman scattering spectrum and as a result it has been confirmed that the resulting diamond were substantially free from impurities.

The resulting diamond-coated chips prepared hereinabove were subjected to wet cutting tests under the following conditions for cutting characteristics for each of the chips.

Work: AlSi alloy (Al: 8% by weight)
Cutting speed: 1,500 meters per minute
Feed: f=0.1 mm/rev
Cut depth: 0.25 mm
Coolant: Aqueous emulsion oil The cutting tests have indicated that no abnormality such as peeling of the diamond film, chipping thereof and so on was shown after having cut to the length of 30,000 meters.

After the cutting tests, the diamond-coated chips were observed for the interface between the diamond film and the surface of the substrate by means of the scanning electromicroscope. It was then found that the interface between them was excellent in continuity.

Further, the diamond-coated chips were estimated for dry cutting tests under the following conditions:

Work: AlSi alloy (Al: 8% by weight )
Cutting speed: 800 meters per minute
Feed: f=0.1 mm/rev
Cut depth: 0.25 mm As a result of the dry cutting tests by cutting the length of 50,000 meters, no abnormality such as peeling and chipping of the diamond film has been found.

After the cutting tests, the diamond-coated chips were observed for the interface between the diamond film and the surface of the substrate by means of the scanning electromicroscope. It was then found that the interface between them was excellent in continuity.

Comparative Example

The sintered body chips in the form of a cutting tool were prepared in substantially the same manner as in the procedures of Example 1, without the heating treatment for crystallization. The X-ray diffractometry of the sintered body has revealed that the peaks of $\beta$-sialon and TiN were observed and no other peaks were observed. In other words, it was confirmed that the sintered body demonstrated no crystalline intergranular phase.

Using the sintered body chip having no crystalline intergranular phase as the substrate, the diamond film was coated on the surface of the substrate in substantially the same manner as in Example 1.

The resulting diamond-coated chip was tested for cutting performance under wet conditions in substantially the same manner as in Example 1. It was found as a result that the diamond film was peeled off from the surface of the substrate when it was cut to the length as short as 3,000 meters.

After the cutting tests, the interface between the diamond film and the substrate of the diamond-coated member was observed by scanning electromicroscopy. The result indicates that gaps were observed among interface portions, the gaps being considered to be formed due to evaporation of the intergranular phase.

EXAMPLES 2 to 6

$Si_3N_4$ powders, $Y_2O_3$ powders, $Al_2O_3$ powders and TiN powders were mixed at the composition as indicated in Table below and the resulting mixtures were formed sintered and subjected to crystallization treatment in substantially the same manner as in Example 1 above, except for heating them at the hours as indicated in Table below, thereby forming sintered body chips (type: SPGN421).

The X-ray diffractometry analysis of the resulting sintered body chips has revealed that the peaks indicative of $\beta$-sialon, TiN and the melilite phase ($Y_2Si_3N_4O_3$) have been observed, thereby confirming that the crystallization of the intergranular glassy phase has proceeded and as a result finding the resulting sintered body to be of the ceramics based on silicon nitride having the crystalline intergranular phase.

The diamond-coated chips were then prepared in substantially the same manner as in Example 1 by using the sintered body chips as substrate.

Using the diamond-coated chips, the wet cutting tests were carried out under substantially the same cutting conditions as in Example 1, thereby determining the cutting length required for peeling the diamond off from the substrate, as shown in Table below.

TABLE

| Examples | 2 | 3 | 4 | 5 | 6 |
|---|---|---|---|---|---|
| Compositions of Base Materials (% by weight) | | | | | |
| $Si_3N_4$ | 80 | 70 | 60 | 85 | 50 |
| $Y_2O_3$ | 10 | 10 | 9 | 10 | 10 |
| $Al_2O_3$ | 5 | 5 | 6 | 5 | 5 |
| TiN | 5 | 15 | 25 | 0 | 35 |
| Crystallization Time (minutes) | 240 | 120 | 120 | 480 | 120 |
| X-ray Diffractometry Analysis | $\beta$-sialon TiN $Y_2Si_3N_4O_3$ | $\beta$-sialon TiN $Y_2Si_3N_4O_3$ | $\beta$-sialon TiN $Y_2Si_3N_4O_3$ | $\beta$-sialon — $Y_2Si_3N_4O_3$ (small peak) | $\beta$-sialon TiN $Y_2Si_3N_4O_3$ |
| Cutting Length For Peeling (meters) | 30,000 | >50,000 | 23,000 | 15,000 | 10,000 |

In accordance with the present invention, the particular ceramics based on silicon nitride (sintered body) having the crystalline intergranular phase are employed as substrate on which the diamond film is to be coated, so that adhesion between the substrate (sintered body) and the diamond film is improved to a remarkable extent. Hence, the present invention can provide the diamond-coated body having high performance, excellent durability and long life, which also can considerably reduce damages resulting from peeling or abrasion of the diamond film when it is practically applied to various super hard tools such as cutting tools, abrasion-resistant parts, and so on.

What is claimed is:

1. A diamond-coated body comprising a diamond film coated by means of vapor phase synthesis on the surface of a substrate comprising a ceramics based on silicon nitride having a crystalline intergranular phase, wherein said substrate is prepared by sintering a body formed of a ceramics based on silicon nitride, whereby is obtained a sintered body having an intergranular glassy phase, cooling the sintered body to at least approximately room temperature, and subjecting the cooled sintered body to crystallization treatment by heating at a temperature from 1400° to 1700° C.

2. A diamond-coated body as claimed in claim 1, wherein said ceramics based on silicon nitride comprises 60% to 90% by weight of silicon nitride and 10% to 40% by weight of at least one oxide selected from the group consisting of $ZrO_2$, MgO, $Al_2O_3$ and $Y_2O_3$.

3. A diamond-coated body as claimed in claim 1, wherein said ceramics based on silicon nitride contains sialon.

4. A diamond-coated body as claimed in claim 1, wherein said ceramics based on silicon nitride contains a Ti compound.

5. A diamond-coated body as claimed in claim 4, wherein said ceramics based on silicon nitride contains the Ti compound in the amount ranging from 1% to 30% by weight on the basis of TiN.

* * * * *